United States Patent
Reisman et al.

(10) Patent No.: US 9,470,772 B2
(45) Date of Patent: Oct. 18, 2016

(54) MAGNETIC RESONANCE IMAGE DISTORTION CORRECTION WITH A REFERENCE VOLUME

(71) Applicants: James G. Reisman, Princeton, NJ (US); Steven Michael Shea, Baltimore, NJ (US)

(72) Inventors: James G. Reisman, Princeton, NJ (US); Steven Michael Shea, Baltimore, NJ (US)

(73) Assignee: SIEMENS HEALTHCARE GMBH, Erlangen (DE)

( * ) Notice: Subject to any disclaimer, the term of this patent is extended or adjusted under 35 U.S.C. 154(b) by 135 days.

(21) Appl. No.: 13/645,571

(22) Filed: Oct. 5, 2012

(65) Prior Publication Data

US 2013/0137968 A1 May 30, 2013

Related U.S. Application Data

(60) Provisional application No. 61/564,936, filed on Nov. 30, 2011.

(51) Int. Cl.
*G01R 33/565* (2006.01)

(52) U.S. Cl.
CPC ... *G01R 33/56572* (2013.01); *G01R 33/56563* (2013.01)

(58) Field of Classification Search
CPC .. A61B 5/0555; A61B 5/4528; A61B 5/055; A61B 6/0485; A61B 6/0421; A61B 6/00; A61B 6/02; A61B 6/5223; A61B 6/5229; A61B 6/5235; A61B 6/5241; A61B 6/52; A61B 19/20; G06T 7/00; G06T 7/0012; G01R 33/58; G01R 33/283; G01R 33/565; G01R 33/56563; G01R 33/56572

USPC .................. 600/410, 415; 324/307, 308, 309
See application file for complete search history.

(56) References Cited

U.S. PATENT DOCUMENTS

| | | | |
|---|---|---|---|
| 2009/0030302 A1* | 1/2009 | Taniguchi et al. | 600/410 |
| 2010/0061612 A1* | 3/2010 | Reisman et al. | 382/131 |
| 2010/0067762 A1* | 3/2010 | Glocker et al. | 382/131 |

OTHER PUBLICATIONS

Spieler, "Resolution and Signal-to-Noise Ratio," Feb. 11, 1999, pp. 1-15.*
Doran et al., "A complete distortion correction for MR images," Mar. 16, 2005, Phys. Med. Biol., 50, pp. 1343-1361.*
J. Sled et al., "Correction for B0 and B1 variations in quantitative measurements using MRI," Magnetic Resonance in Medicine, vol. 43, No. 4, pp. 589-593, 2000.
B. Zitova et al., "Image Registration Methods: A Survey," Image and Vision Computing, vol. 21, No. 11, pp. 977-1000(24), Oct. 2003.
Siemens Press Release: Tim Technology Powers New Advances in MRI to Drive Workflow, pp. 1-4 (2006).

* cited by examiner

Primary Examiner — Tse Chen
Assistant Examiner — Nate S Sunwoo

(57) ABSTRACT

Distortion correction is provided in magnetic resonance imaging. Distortions in one volume are corrected using another volume. The isocenter of the other volume is nearer to an edge of the one volume than the isocenter of the one volume. Using data registration, the other volume is used to correct distortions in the one volume. The other volume may be acquired in little time relative to the acquisition of the one volume by having a smaller field of view, lower resolution, and/or smaller signal-to-noise ratio. The other volume may be a connecting volume for correcting distortions in two volumes to be composed together.

18 Claims, 2 Drawing Sheets

MAGNETIC RESONANCE IMAGE DISTORTION CORRECTION WITH A REFERENCE VOLUME

RELATED APPLICATIONS

The present patent document claims the benefit of the filing date under 35 U.S.C. §119(e) of Provisional U.S. Patent Application Ser. No. 61/564,936, filed Nov. 30, 2011, which is hereby incorporated by reference.

BACKGROUND

The present embodiments relate to magnetic resonance imaging (MRI) of a volume. The increase of the field strength and bore size of newer MRI imaging machines provides the opportunity for improved image resolution, quality, and patient comfort. A challenge with these systems is localized distortion in the volumes caused by the increase in magnetic field variation ($B_0$) and gradient non-linearity. MRI volumes are susceptible to $B_0$ and gradient non-linearity distortions as the distance from the magnet isocenter increases. The distortions reduce the reliable representation of scanned structure at the periphery of the acquired volumes.

Whole body MRI scans of a patient may be formed from 3-5 individual, high resolution volume acquisitions which are composed together to capture a complete scan of the patient. Since $B_0$ and gradient distortion effects are most evident in the leading or trailing edges of a MRI volume, the intersections of neighboring volumes in a series tend to be unreliable, interfering with proper composing. Either (or both) of the edges of the neighboring volumes may be effected by distortion. Therefore, it is not readily deducible to determine how to correctly compose overlapping regions. Anatomy measurements in the overlapping regions may not be reliably trusted.

To avoid distortion, a continuous motion low-resolution scan (e.g., Siemens TIMCT whole-body single scan scout protocol) samples the patient only at the isocenter. The movement of the patient by the patient bed is relied on to place different positions of the patient at the isocenter in an ongoing scan. This scan is resistant to peripheral distortion. However, the number of MRI scanners with the ability to generate CT-like continuous scans is limited.

The distortion may be reduced or corrected in part by phantom calibration and feedback sensors. The distortion is detected and used to adjust the MRI scanner. However, $B_0$ and gradient distortion are not completely solvable using calibration techniques either with or without a phantom since the mass/density distribution is idiosyncratic to a particular subject being scanned. The differences between patient and phantom and other transient effects degrade performance of calibration techniques.

BRIEF SUMMARY

By way of introduction, the preferred embodiments described below include methods, systems, and computer readable storage media for distortion correction in magnetic resonance imaging. Distortions in the one volume are corrected using another volume. The isocenter of the other volume is nearer to an edge of the one volume than the isocenter of the one volume. Using data registration, the other volume is used to correct distortions in the one volume. The other volume may be acquired in little time relative to the acquisition of the one volume by having a smaller field of view, lower resolution, and/or smaller signal-to-noise ratio. The other volume may be a connecting volume for correcting distortions in two volumes to be composed together.

In a first aspect, a method is provided for distortion correction in magnetic resonance imaging. First and second magnetic resonance volumes representing first and second different portions of a patient at a first resolution are acquired. A third magnetic resonance volume representing a third portion of the patient is acquired. The third portion overlaps with the first and second portions. The third magnetic resonance volume is acquired at a second resolution less than the first resolution. The third magnetic resonance volume is non-rigidly registered with the first and second magnetic resonance volumes. The distortions in the first and second magnetic resonance volumes are corrected based on the registering of the third volume with the first and second magnetic resonance volume. The distortion corrected first magnetic resonance volume is then composed with the distortion corrected second magnetic volume. An image is generated as a function of the composed first and second magnetic resonance volumes.

In a second aspect, a system is provided for distortion correction in magnetic resonance imaging. A magnetic resonance scanner has an isocenter. A patient bed is operable to position different parts of a patient at the isocenter for sequential volume scans and a connective volume scan. A processor is configured to correct for magnetic field non-linearity distortion of the sequential volume scans as a function of registration of data from the connective volume scan to the sequential volume scans.

In a third aspect, a non-transitory computer readable storage medium has stored therein data representing instructions executable by a programmed processor for distortion correction in magnetic resonance imaging. The storage medium includes instructions for obtaining first and second sets of voxels representing different volumes of a patient, the different volumes overlapping, registering the first set of voxels with the second set of voxels, the registering indicating a distortion in the first set of voxels, and correcting for the distortion in the first set of voxels.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

The most reliable reading from a MRI scanner is obtained at the isocenter of the MRI magnet. A solution to correct distortion utilizes this property. Magnetic resonance image distortion is corrected using a connective reference volume. Distortion correction is applied by acquiring a special low acquisition time connective reference scan at the periphery of the standard higher resolution scan. The reference scan possesses a narrow field of view with a closer magnet isocenter, and therefore is relatively resistant to distortive effects. Re-centering the scanner and scanning a region susceptible to distortion provides a "ground truth" reference. Non-rigid registration is then applied to map the distortion between the connective reference scan and the higher resolution scan to generate a corrective transform. The transform is used for distortion correction of the standard or higher resolution scan.

Additional scanning can take additional scanner resource time, which is a valuable commodity in most medical facilities. However, non-rigid registration does not require a reference scan to be of the same resolution or signal-to-noise ratio as the original high resolution scan. By using lower resolution, lower signal-to-noise ratio, and/or a smaller field of view, the additional scanning time for the connective scan may be acceptable, taking little extra time.

Figure 1:
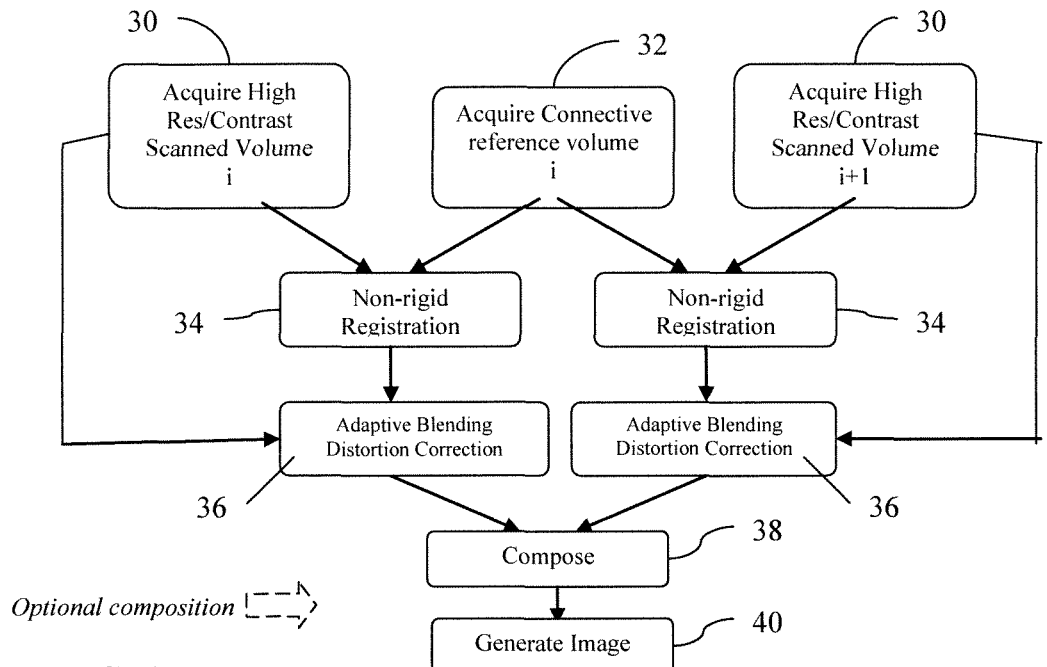
FIG. 1 is a flow chart diagram of an example embodiment of a method for distortion correction in magnetic resonance imaging.

FIG. 1 shows a method for distortion correction in magnetic resonance imaging. The method is performed by the MR system 10 of FIG. 3, a different system, a processor, or a computer. The acts are performed in the order shown, but other orders may be provided. For example, the different volumes may be acquired in any sequence. Additional, different, or fewer acts may be provided. For example, acts 38 and 40 are not performed. As another example, one or more quantities or measures are determined from the distortion corrected volumes with or without the composing of act 38 and/or the imaging of act 40.

MR data is obtained. The MR data is obtained when the patient is scanned or obtained from memory where the patient was previously scanned. The MR data represents anatomy of a patient. The patient is positioned relative to the MR scanner and scanned. By positioning the patient at different locations, different sets of data are acquired.

The MR data represents a volume of the patient, such as representing voxels in an N×M×O arrangement. The MR data is a set of values for voxels representing a volume of the patient. Alternatively, the MR data represents a plurality of separate slices that may be formatted as voxels.

A MRI system is used to scan a volume within a patient. One or more transmitters produce an RF excitation field. A desired number of the transmitters are employed and connected through a corresponding number of transmit/receive switches to a corresponding number N of the coils in an RF coil array. The combined RF fields of the coil elements produce a prescribed $B_1$ field throughout the region of interest in the subject.

The signal produced by the subject in response to the RF excitation field is picked up by a coil array and applied to the inputs of the set of receive channels. The received signal is at or around the Larmor frequency. When the $B_1$ field is not being produced, the transmit/receive switches connect each of the receive channels to the respective coil elements. Signals produced by the excited spins in the subject are picked up and separately processed as k-space and/or object space data.

Any MR procedure for acquiring data representing anatomy or tissue may be used. For example, T1-weighted turbo spin echo, T2-weighted turbo spin-echo, and/or T1-weighted gradient echo images are obtained. The protocol used may be based on the type of anatomy of interest. For example, scans for visualizing the spinal discs, cord, and bone are used in a study of the spine.

One or more component volumes are scanned in act 30. The component volumes are used for imaging, measurement, or diagnosis. In one embodiment, a single component volume is scanned for imaging. In another embodiment represented in FIG. 1, two or more component volumes are scanned for imaging in act 30. Each scanned component volume for imaging is used to represent the patient in an image. For whole body or spinal cord scanning, two or more overlapping component volumes are scanned.

Figure 2:
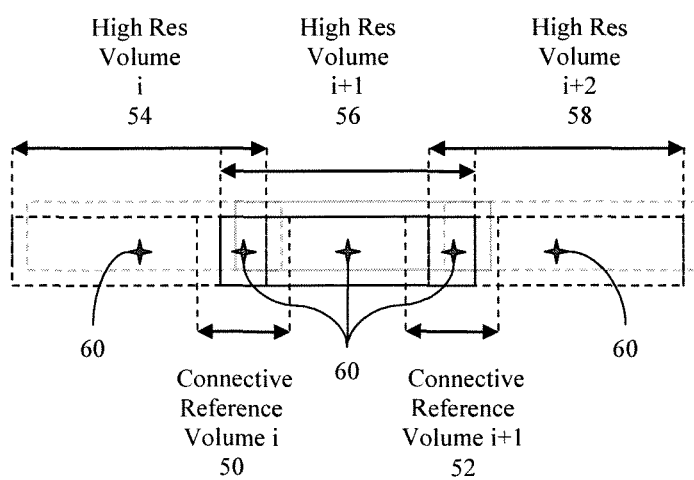
FIG. 2 is a graphical representation of an example spatial relationship of volumes for distortion correction.

FIG. 2 shows an example of acquiring three component volumes 54, 56, and 58. Each component volume is represented by a set of voxels. The component volume 54 overlaps with the component volume 56, and the component volume 56 also overlaps with the component volume 58. Any amount of overlap may be provided, such as about 5-25% of the voxels in the adjacent component volumes 54, 56, 58 overlapping. More or less overlap may be provided.

Each component volume is scanned with a different part of the patient positioned at the isocenter 60 of the magnet of the MRI scanner. The isocenters relative to the patient for the component volumes are any distance apart, such as being twenty or more (e.g., 30-40) centimeters apart. Edges of the component volume may have greater distortion at the edges. By spacing the isocenters along the patient, different portions of the patient are scanned. For each component volume, the patient is held substantially stationary relative to the isocenter. Substantially is used to account for heart motion, breathing motion, and other voluntary or involuntary motion of the patient despite efforts to remain still.

The component volumes are acquired at one or more resolutions. Different component volumes have the same or different resolution. The dimensions of the voxels are set by the scanning protocol, capabilities of the MRI system, user settings, or other criteria. Other aspects of the scans of the volumes in act 30 may be set, such as the signal-to-noise ratio and/or contrast. Based on the settings and field of view, each scan takes a particular amount of time. For example, a component volume scan may take seconds (e.g., 30 seconds) or minutes (e.g., 2-10 minutes) to acquire the data representing the voxels.

Based on the size of the component volumes scanned for any given isocenter position, more or less distortion may result. For voxels further from the isocenter, greater distortion due to $B_0$ and gradient distortions may occur. The edges or periphery of the component volumes may be subject to greater distortions. Since each scan takes a given amount of time, using a greater number of scans with a narrower field of view but the same resolution and/or signal-to-noise ratios to avoid distortion may be undesired.

In act 32, one or more connective volumes are acquired. The connective volumes are not used to determine intensities for displayed images. The imaging is not of the connective volumes. Instead, the connective volume is acquired to correct distortion of the component volumes used for imaging, measurement, or diagnosis. Accordingly, the connective volume is acquired with settings to reduce the acquisition time. Referring to FIG. 2, when a series of high resolution MRI component volumes 54, 56, 58 are planned for acquisition, additional connective reference volumes 50, 52 are acquired.

Any protocol may be used for acquiring the connective volume. For example, the same protocol or type of scanning is performed for the connective volume as for the component volumes. In other embodiments, a different protocol is used. If a different protocol is used, the protocols may be selected to provide similar or same contrast of tissues as in the component volumes. For example, if bone appears dark and a spinal cord bright in one component volume, the protocol for the connective volume is selected to provide a dark bone and a bright spinal cord appearance. The specific protocol and volume of interest used for the connective scans may depend upon the requirements for the series (e.g., protocol used for the component volumes or the type of anatomy being scanned and the specifications of the scanner used).

The connective volume represents a different portion of the patient. The isocenter of the connective volume is placed at or nearer to the edge of one or more component volumes from act 30 than the isocenters for those component volumes. For example, FIG. 2 shows the isocenters 60 of the connective reference frames 50 and 52 being centered in an overlapping region of the component volumes 54, 56 and 56, 58. Where the volumes 54, 56, and 58 have the same field of view, the isocenters 60 of the connective volumes are centered between the isocenters 60 of the volumes 54, 56 and 56, 58. Positions other than centered within or even adjacent to but outside of the overlapping of the component volumes 54, 56 or 56, 58 may be used. The connective volume 50, 52 overlaps with one or more of the component volumes 54, 56, 58.

The field of view of the connective volume 50, 52 is less than for the component volumes 54, 56, 58. For example, the field of view overlaps one or two of the component volumes 54, 56, 58 by less than 20% of the component volumes 54, 56, 58. The field of view may extend beyond or be entirely within the overlap of the component volumes 54, 56 or 56, 58. Greater or lesser overlap and/or field of view may be provided. By using a narrower field of view, less scan time may be needed. Data for fewer voxels may be acquired.

Other settings may result in less scan time and/or fewer voxels for the connective volume 50, 52. For example, the resolution of the connective volumes 50, 52 is lower than the component volumes 54, 56, 58. Any degree of decrease may be used, such as a 50 percent reduction is resolution. By acquiring with a lower resolution, the size of each voxel is increased, resulting in fewer voxels given a same field of view. The resolution is lower for one or both of any overlapping component volumes 54, 56 or 56, 58.

A lower signal-to-noise ratio may be used for the connective volume 50, 52 than for the component volumes 54, 56, 58. The same structure is represented, but with lower signal-to-noise ratio. The lower signal-to-noise ratio may result from using a different protocol, different coils, different number of coils, different pulse sequences, different resolution, or other scanning differences to reduce the time to scan the volume.

The connective volume 50, 52 is acquired over a period. The duration of the period is less than the duration to acquire each one of the component volumes 54, 56, 58. For example, the duration of the scan for the component volume 54 is at least ten times longer than the duration of the scan for the connective volume 50. Due to the settings for scanning (e.g., field of view, resolution, protocol used), less time is needed to scan the connective volume 50. MRI acquisition time is a function of the volume of interest size, signal-to-noise requirements, and resolution. The connective volume 50 may be collected with little additional acquisition time as part of a multi-station acquisition. An example would be to acquire a connective reference volume at 50% resolution, and with a component volume of interest covering 15% of each volume. With overlap, a connective reference volume of this size may contain as little as 2% of the voxels of the high resolution component volumes, and a relatively negligible additional acquisition time burden. Rather than acquiring a greater number of volumes at a same or full resolution, connective volumes are acquired in less time.

With just one component volume 54, the connective scan may acquire a connective volume 50 not connecting the volume 54 to another volume. The connective volume 50 may be used to correct distortions using registration in the single component volume 54. In other embodiments, more than one connective volume 50 is acquired so as to correct different edges of the component volume 54. In yet other embodiments, the connective volume 50 is between two or more component volumes 54, 56. Where more than two component volumes are to be composed, more than one connective volume 50, 52 is acquired. For example, a connective volume 50, 52 is provided for each adjacent pair of component volumes 54, 56, 58.

In act 34, the voxel data of the connective volume 50 is registered with one or more component volumes 54, 56. For example, any connective volume 50, 52 is registered with any component volume 54, 56, 58 overlapping the field of view of the connective volume 50, 52. A separate registration is provided between any given connective volume 50, 52 and each other component volume 54, 56, 58 overlapping with the given connective volume 50, 52. In the example of FIG. 2, both the leading and trailing high resolution component volumes 54, 56 are separately registered to the reference connective reference volume 50.

In one embodiment, the registration is a non-rigid registration. The relative spatial position of the voxels is not maintained, instead allowing for one or more degrees of freedom to warp the position of the voxels relative to each other to account for differences in spatial position between the volumes. The registration may be rigid along one or more degrees of freedom. In one embodiment, the registration is non-rigid along all three spatial and all three rotational axes.

Any registration may be used. The registration geometrically aligns two volumes. The registration may be based on the data in general, such as volume-based approaches. In other embodiments, the registration relies on segmentation of features and aligns based on the features. Features are detected in each volume. The features are mapped or labeled. The matching features from the different volumes are determined, and a transformation relating the spatial positions is calculated. Other registration approaches may be used.

In one embodiment, elastic registration is used. The elastic registration algorithm may be based on the maximization of an intensity-based similarity metric between the two volumes. The metric may be selected from the group of local cross correlation and mutual information. The elastic registration algorithm may model the deformation as a smooth vector field that indicates, for each pixel in one of the image volumes, its corresponding pixel location in a second image in the other image volume. The deformation and its inverse may be estimated iteratively by maximizing an intensity-based similarity metric and are regularized using a low-pass filter.

The registration generates a transformation matrix. The matrix represents shifts in position for each voxel to match the two volumes. Since the voxels of the component volumes 54, 56, 58 may be subject to distortion at the edges overlapping with the connective volume 50, 52, the registration determines the shifts to counteract the distortion. Different voxels may be shifted by different amounts and/or in different directions. The transformation matrix represents the difference between the distorted component volume and the connective volume, indicating the distortion.

In act 36, the distortions in the component volumes 54, 56, 58 are corrected. The correction is based on the registrations with the connective volumes. For example, the distortion of the component volume 54 is corrected based on the registration with the connective volume 50. The distortion of the component volume 56 at one end is corrected based on the registration with the connective volume 50 and on the other end is corrected based on the registration with the connective volume 52. The distortion of the component volume 58 at one end is corrected based on the registration with the connective volume 52.

The correction shifts the contribution from and/or position for voxels. The transformation matrix is applied to the component volumes 54, 56, 58 to implement the correction. Any correction or transformation approach may be used. For example, an adaptive blending distortion correction is used. Correction may be achieved by applying the displacement map derived from the registration technique.

In one embodiment, the voxels of the volume 54, 56, 58 in the overlapping region with the connective volume 50, 52 are morphed. Alpha morphing or other morphing of the overlapping parts is used. For example, the registration, correcting, and/or composing described in U.S. Published Patent Application No. 2010/0061612, the disclosure of which is incorporated herein by reference, is used. In alpha morphing, a distortion map is first generated for the overlapping parts of the image volumes using non-rigid registration. The distortion map indicates the degree and direction of translation needed to bring two volumes into alignment. This correction is applied gradually for a given voxel depending upon the location. The strength of the correction is zero at the near edge of the overlapping region, and 100% at the far edge of the overlapping region. This is applied to both of the overlapping volumes to create a seamless alignment. The non-overlapping parts of volumes are treated as not distorted and/or are not altered. In other embodiments, extrapolation may be used to morph data of the volume outside of the overlapping region.

The correction is provided without a physics model. In alternative embodiments, the distortion is modeled based on the MRI system. The model may be used to correct the distortion. Since the distortion may be patient specific, the distortion is further corrected using registration with connective volumes. The physics model is used to first un-distort the volume. The connective volume registration is then used to complete further distortion correction. Calibration or other distortion techniques may be used in addition to registration with connective volumes.

In act 38, the distortion corrected volumes are composed. The composing forms one larger volume from two or more other volumes. In the example of FIG. 2, the sets of voxels for the volumes 54, 56, 58 are combined into one set of voxels. The combination does not include voxels from the connective volumes 50, 52, but may. The composing creates a set of voxels representing a larger volume than was scanned for any given isocenter position.

To combine the volumes, the volumes are aligned. The registration of act 34 is non-rigid to correct for distortion. This non-rigid registration may also align the volumes overall. Alternatively, the overlap in the volumes to be composed is used. The data is correlated or otherwise rigidly registered to find an alignment. The alignment using data registration is performed with the distortion corrected data. In alternative embodiments, sensors or other input are used to align the volumes. The patient may be assumed not to have moved and the volumes treated as aligned by being imaged with a same MRI system with the patient remaining on and being positioned by the patient bed.

The alignment indicates relative offset of the volumes. The data before or after distortion correction is aligned. The corrected high resolution volumes, both having been registered to the connective reference volume, are then composed with each other.

Any combination function may be used. For example, the voxel values are averaged. Using a nearest neighbor or interpolation, the value for each voxel in the composed volume is determined. By averaging where more than one voxel of the component volumes represents a same voxel of the composed volume, the voxels are combined. In another embodiment, alpha blending is used. The relative contribution of each component volume increases closer to the isocenter and decreases further from the isocenter of that component volume. This alpha transition occurs in the overlap region. The alpha weighting is coordinated between the two or more component volumes for the overlap such that the sum of the weights is unity. Other combination functions may be used.

In act 40, an image is generated. The image is generated from the composed volume. The larger set of voxels formed from composing is used to generate one or more images. Alternatively or additionally, images are generated from the distortion corrected volumes without the composing.

The images are renderings. Three-dimensional renderings are performed. Any type of rendering may be used, such as projection or surface rendering. The data may be filtered, segmented, or otherwise processed for generating the image or images. In alternative embodiments, the images are of a standardized, arbitrary or other plane through the volume or volumes. Values of voxels are interpolated to a plane and a two-dimensional image is generated. Multi-planar reconstructions may be generated.

In the example of FIG. 2, three higher resolution volumes are created and distortion corrected. In other embodiments, a single high resolution volume is created and distortion corrected with a relatively lower resolution volume. MRI volume distortion correction is provided regardless of the number of volumes used for imaging or measuring. For whole body or other larger region imaging, improved image quality may be provided by the distortion correction. The distortion correction may have a minimal additional acquisition time resource cost.

Figure 3:
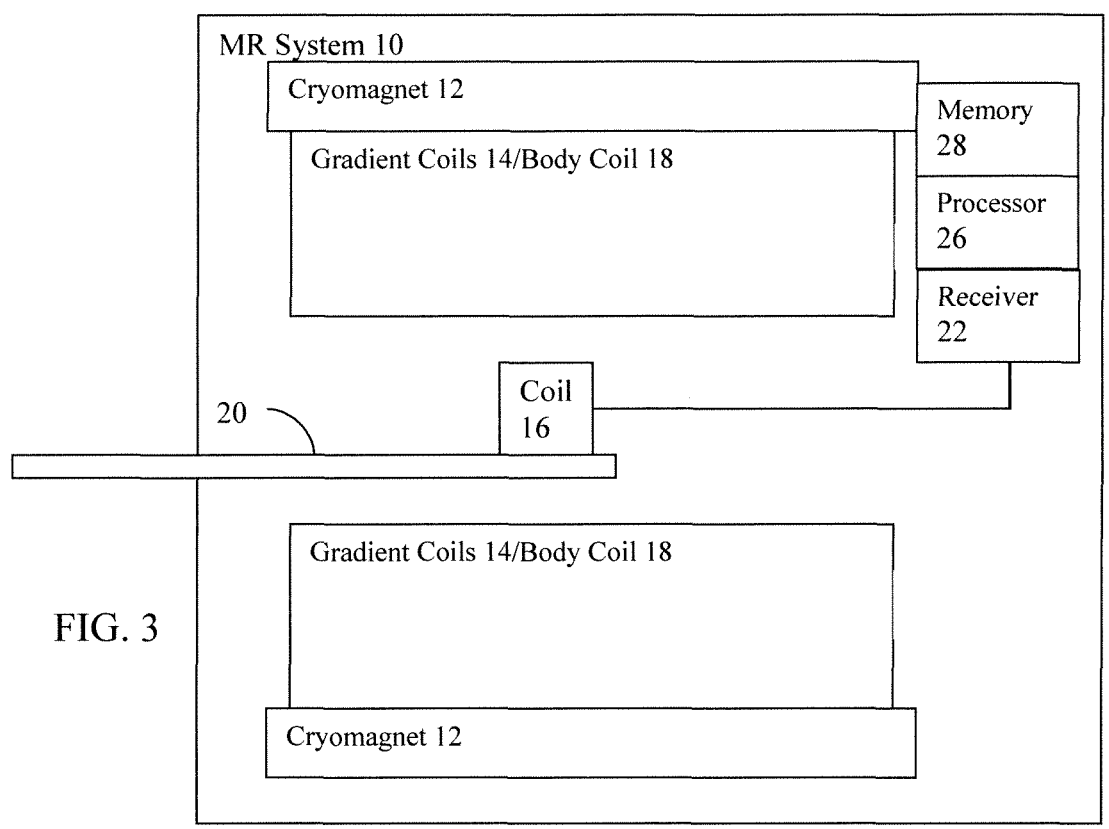
FIG. 3 is a block diagram of one embodiment of a system for distortion correction in magnetic resonance imaging.

FIG. 3 shows a system 10 for distortion correction in magnetic resonance imaging. The system 10 includes a cryomagnet 12, gradient coils 14, whole body coil 18, local coil 16, patient bed 20, MR receiver 22, processor 26, and memory 28. Additional, different, or fewer components may be provided. For example, another local coil or surface coil is provided. As another example, no local coils 16 are used.

Other parts of the MR system are provided within a same housing, within a same room (e.g., within the radio frequency cabin), within a same facility, or connected remotely. The other parts of the MR portion may include cooling systems, pulse generation systems, image processing systems, and user interface systems. Any now known or later developed MR imaging system may be used with the modifications discussed herein. The location of the different components of the MR system is within or outside the RF cabin, such as the image processing, tomography, power generation, and user interface components being outside the RF cabin. Power cables, cooling lines, and communication cables connect the pulse generation, magnet control, and detection systems within the RF cabin with the components outside the RF cabin through a filter plate.

The processor 26 and memory 28 are part of a medical imaging system, such as the MR system 10. In one embodiment, the processor 26 and memory 28 are part of the MR receiver 22. Alternatively the processor 26 and memory 28 are part of an archival and/or image processing system, such as associated with a medical records database workstation or server. In other embodiments, the processor 26 and memory 28 are a personal computer, such as desktop or laptop, a workstation, a server, a network, or combinations thereof. The processor 26 and memory 28 may be provided without other components for implementing the method.

The magnetic resonance scanner includes the cryomagnet 12, gradient coils 14, body coil 18, and any local coils 16. The cryomagnet 12, gradient coils 14, and body coil 18 are in the RF cabin, such as a room isolated by a Faraday cage. A tubular or laterally open examination subject bore encloses a field of view. A more open arrangement may be provided. The patient bed 20 (e.g., a patient gurney or table) supports an examination subject such as, for example, a patient with a local coil arrangement, including the coil 16. The patient bed 20 may be moved into the examination subject bore in order to generate images of the patient. Any local coils 16 are placed on, under, against, or in the patient. Received signals may be transmitted by the local coil arrangement to the MR receiver 22 via, for example, coaxial cable or radio link (e.g., via antennas) for localization.

In order to examine the patient, different magnetic fields are temporally and spatially coordinated with one another for application to the patient. The cryomagnet 12 generates a strong static main magnetic field $B_0$ in the range of, for example, 0.2 Tesla to 3 Tesla or more. The main magnetic field $B_0$ is approximately homogeneous in the field of view. Near an isocenter of the main magnetic field and/or gradient coils 14, this approximation is more accurate relative to the resolution. Further from the isocenter, the approximation becomes less accurate. Distortions significant to or noticeable relative to the resolution occur spaced from the isocenter, such as spaced within a field of view but away from the isocenter along the z or patient length axis.

The nuclear spins of atomic nuclei of the patient are excited via magnetic radio-frequency excitation pulses that are transmitted via a radio-frequency antenna, shown in FIG. 1 in simplified form as a whole body coil 18, and/or possibly a local coil arrangement. Radio-frequency excitation pulses are generated, for example, by a pulse generation unit controlled by a pulse sequence control unit. After being amplified using a radio-frequency amplifier, the radio-frequency excitation pulses are routed to the body coil 18 and/or local coils 16. The body coil 18 is a single-part or includes multiple coils. The signals are at a given frequency band. For example, the MR frequency for a 3 Tesla system is about 123 MHz+/−500 KHz. Different center frequencies and/or bandwidths may be used.

The gradient coils 14 radiate magnetic gradient fields in the course of a measurement in order to produce selective layer excitation and for spatial encoding of the measurement signal. The gradient coils 14 are controlled by a gradient coil control unit that, like the pulse generation unit, is connected to the pulse sequence control unit.

The signals emitted by the excited nuclear spins are received by the local coils 16 and/or the body coil 18. In some MR tomography procedures, images having a high signal-to-noise ratio (SNR) may be recorded using local coil arrangements (e.g., loops, local coils). The local coil arrangements (e.g., antenna systems) are disposed in the immediate vicinity of the examination subject on (anterior) or under (posterior) or in the patient. The received signals are amplified by associated radio-frequency preamplifiers, transmitted in analog or digitized form, and processed further and digitized by the MR receiver 22. The recorded measured data is stored in digitized form as complex numeric values in a k-space matrix. An associated MR image of the examination subject may be reconstructed using a one or multidimensional Fourier transform from the k-space matrix populated with values. For distortion correction, the reconstructed data may be used without or in addition to generating an image.

In the course of an MR measurement, the excited nuclei induce a voltage in the local coils 16. The induced voltage is amplified by a low-noise preamplifier (e.g., LNA, preamp) and forwarded to the MR receiver 22.

The MR receiver 22 connects with the coils 16. The connection is wired (e.g., coaxial cable) or wireless. The connection is for data from the coils 16 to be transmitted to and received by the MR receiver 22. The data is K-space data. In response to an MR pulse, the coils 16 receive the K-space data and transmit the data to the MR receiver 22. Any pulse sequence may be used. Any spatial resolution may be provided, such as a spatial resolution of 0.78 mm.

The MR receiver 22 includes the processor 26 or another processor (e.g., digital signal processor, field programmable gate array, or application specific circuit for applying an inverse Fourier transform) for reconstructing the K-space data. The MR receiver 22 is configured by hardware or software to calculate data in the spatial domain from the K-space data. The processor 26 applies an inverse Fast Fourier transform to calculate the power spectrum of the projection data. The power spectrum provides intensity as a function of frequency. The frequency corresponds to space or distance. The MR data as acquired is a function of frequency and after applying inverse FT becomes a function of space. Any transform for reconstructing spatial data from the K-space data may be used.

The MR system 10 and MR scanner are configured by hardware and/or software to acquire sets of voxels or volume scans. The data is in the spatial domain. Using the same or different protocols, one or more higher resolution volumes are acquired for imaging, measurement or diagnosis. Using the same or different protocols, one or more lower resolution volumes are acquired for distortion correction. In addition or as an alternative to higher and lower resolution, higher and lower signal-to-noise ratio may be used.

The lower resolution volumes connect with the higher resolution volumes, such as overlapping. Given the fields of view, the high resolution volumes may or may not overlap along the z-axis. The lower resolution, connective volume overlaps with one or more higher resolution volumes along the z-axis. Any amount of overlap may be used. By using a smaller field of view and lower resolution for the connective volumes than the higher resolution volumes, the number of voxels and corresponding scan time for the connective volumes may be relatively less than for the higher resolution volumes. For example, the connective volumes have fewer than ten percent (e.g., 2-5%) of the number of voxels as the higher resolution volume and take a correspondingly less amount of time (e.g., 2-10%) to acquire.

For each volume scan, the patient is repositioned along the z-axis by the patient bed 20 and scanned. During the scanning, the patient is substantially stationary. The patient bed is moved by a machine or the user to desired positions so that different parts of the patient are at the isocenter of the MR scanner for different volume scans. As a result, the isocenters for each volume are at a different location. The volumes are acquired sequentially in any order. In one embodiment, the volumes are acquired in sequence through a series of adjacent isocenters relative to the patient. In other embodiments, the higher resolution volumes are acquired in sequence, and then the lower resolution connective volumes are acquired in sequence. Other orders may be used.

The processor 26 is a general processor, central processing unit, control processor, graphics processor, digital signal processor, three-dimensional rendering processor, image processor, application specific integrated circuit, field programmable gate array, digital circuit, analog circuit, combinations thereof, or other now known or later developed device for distortion correction. The processor 26 is a single device or multiple devices operating in serial, parallel, or separately. The processor 26 may be a main processor of a computer, such as a laptop or desktop computer, or may be a processor for handling some tasks in a larger system, such as being part of the MR receiver 22 or MR imaging system 10. The processor 26 is configured by instructions, design, hardware, and/or software to perform the acts discussed herein, such as correcting for distortion using one or more connecting volumes.

The processor 26 is configured to correct for magnetic field non-linearity distortion. A sequence of volume scans is acquired. Each of the volume scans is distortion corrected. The correction is performed by registration with one or more connective volume scans. The connective volume scans have an isocenter close to the periphery of the volume scans to be corrected, providing a source of data associated with less distortion. The registration determines the distortion of the volume scans. Any registration is used, such as a non-rigid registration. The registration is performed for regions where the volume scan and the connective volume scan overlap. Based on the registration, the volume scan is morphed. A transform matrix determined by the registration is used to morph the volume scan.

The processor 26 is configured to compose the volume scans. After distortion correction, the volume scans are combined. Due to the distortion correction, data representing the same structure is combined. The connective volume scan is not used in the composed volume. The values of the voxels of the connective volume are not combined with other volumes. The composed volumes form a larger volume in terms of represented portion of the patient and number of voxels. The larger volume is used for imaging, measurements, and/or further processing.

The memory 28 is a graphics processing memory, a video random access memory, a random access memory, system memory, random access memory, cache memory, hard drive, optical media, magnetic media, flash drive, buffer, database, combinations thereof, or other now known or later developed memory device for storing data or video information. The memory 28 is part of an imaging system, part of a computer associated with the processor 26, part of a database, part of another system, a picture archival memory, or a standalone device.

The memory 28 stores K-space data, reconstructed data in the spatial domain (e.g., voxel values or intensities), and/or a transform matrix. As an alternative or in addition, the memory 28 stores protocols for acquiring volumes, patient data for spacing isocenters, user input of settings, and/or data being processed.

The memory 28 or other memory is alternatively or additionally a computer readable storage medium storing data representing instructions executable by the programmed processor 26 for distortion correction in magnetic resonance imaging. The instructions for implementing the processes, methods and/or techniques discussed herein are provided on non-transitory computer-readable storage media or memories, such as a cache, buffer, RAM, removable media, hard drive or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone, or in combination. Likewise, processing strategies may include multiprocessing, multitasking, parallel processing, and the like.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

A display may be provided for displaying an image or images generated from one or more distortion corrected volumes and/or displaying measurements from the distortion corrected volumes. The display is a monitor, LCD, projector, plasma display, CRT, printer, or other now known or later developed devise for outputting visual information. The display receives images, graphics, or other information from the processor 26 or memory 28.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for distortion correction in magnetic resonance imaging, the method comprising:
    acquiring first and second magnetic resonance volumes representing first and second different portions of a patient at a first resolution, the first and second magnetic resonance volumes having first and second field of views, and wherein the first and second different portions have an overlapping area;
    acquiring a third magnetic resonance volume representing a third portion of the patient and having a third field of view, the third magnetic resonance volume having an isocenter in the overlapping area, having a field of view smaller than the first and the second field of view, and acquired at a second resolution less than the first resolution;
    non-rigidly registering the third magnetic resonance volume with the first magnetic resonance volume;
    correcting distortion in the first magnetic resonance volume based on the registering between the first and third magnetic resonance volumes;
    non-rigidly registering the third magnetic resonance volume with the second magnetic resonance volume;
    correcting distortion in the second magnetic resonance volume based on the registering between the second and third magnetic resonance volumes;

composing the distortion corrected first magnetic resonance volume with the distortion corrected second magnetic volume; and generating an image as a function of the composed first and second magnetic resonance volumes.

2. The method of claim 1 wherein acquiring the first and second magnetic resonance volumes representing the first and the second different portions of the patient comprise scanning the patient with isocenters of the first and second magnetic resonance volumes at least twenty centimeters apart, and wherein acquiring the third magnetic resonance volume comprises acquiring with an isocenter centered between the isocenters of the first and second magnetic resonance volumes and with a field of view overlapping less than 20% of each of the first and second magnetic resonance volumes.

3. The method of claim 1 wherein acquiring the third magnetic resonance volume takes less than a tenth of the time required to acquire each of the first and second magnetic resonance volumes.

4. The method of claim 1 wherein acquiring the first, second and third magnetic resonance volumes comprises acquiring the third magnetic resonance volumes with a lower signal to noise ratio than acquiring the first and second magnetic resonance volumes.

5. The method of claim 1 wherein acquiring the first and second magnetic resonance volumes comprise acquiring, during a whole body scan, with the patient substantially stationary at different positions relative to a magnetic resonance scanner, at least one edge of the first and second magnetic resonance volumes subject to $B_0$ and gradient distortions.

6. The method of claim 1 wherein non-rigidly registering comprises generating a transformation matrix representing differences in position of voxels.

7. The method of claim 6 wherein correcting comprises applying the transformation matrix.

8. The method of claim 1 wherein non-rigidly registering comprises elastically registering.

9. The method of claim 1 wherein correcting comprises alpha-morphing parts of the first and second magnetic resonance volumes overlapping with the third magnetic resonance volume.

10. The method of claim 1 wherein composing comprises aligning the first distortion corrected magnetic resonance volume with the second distortion corrected magnetic resonance volume and alpha blending a first region of the first distortion corrected magnetic resonance volume overlapping with the second distortion corrected magnetic resonance volume.

11. A system for distortion correction in magnetic resonance imaging, the system comprising:
a magnetic resonance scanner having an isocenter, the magnetic resonance scanner configured to acquire sequential volume scans and a connective volume scan, wherein an isocenter of the connective volume scan is in an overlapping portion of the sequential volume scans, having a field of view smaller than a field of view of the sequential volume scans and a resolution less than a resolution of the sequential volume scans;
a patient bed operable to position different parts of a patient at the isocenter for the sequential volume scans and the connective volume scan; and
a processor configured to:
receive the sequential volume scans and the connective volume scan;
non-rigidly register the connective volume scan with each of the sequential volume scans separately;
correct for magnetic field non-linearity distortion in each of the sequential volume scans separately based on the registration between the connective volume scan with each of the sequential volume scans; and
compose each of the distortion corrected sequential volume scans together without composing the connective volume scan.

12. The system of claim 11 wherein the magnetic resonance scanner is configured to acquire the connective volume scan with fewer than ten percent of a number of voxels of each of the sequential volume scans, the connective volume scan having a lower resolution and a lower signal-to-noise ratio than each of the sequential volume scans.

13. The system of claim 11 wherein the magnetic resonance scanner is configured to acquire the connective volume scan in less than ten percent of a time to acquire each of the sequential volume scans.

14. The system of claim 11 wherein the magnetic resonance scanner is configured to acquire the connective volume scan overlapping ends of the sequential volumes, and wherein the processor is configured to morph the ends of the sequential volumes with a transformation matrix determined from the registration.

15. The system of claim 11 wherein the processor is configured to generate an image as a function of the composed sequential volume scans.

16. In a non-transitory computer readable storage medium having stored therein data representing instructions executable by a programmed processor for distortion correction in magnetic resonance imaging, the storage medium comprising instructions for:
obtaining first and second sets of voxels representing a first and a second different volumes of a patient, wherein the first and the second different volumes include an overlapping portion of the patient;
obtaining a third set of voxels representing a third different volume of the patient at a resolution less than the first and second sets of voxels, wherein the third different volume of the patent includes the overlapping portion of the patient, wherein an isocenter of the third set of voxels is in the overlapping portion of the patient;
registering the first and the second set of voxels with the third set of voxels separately, the registering generating a transformation indicating differences between the first and second sets of voxels and the third set of voxels;
correcting for the distortion in each of the first and second sets of voxels separately based on the transformation; and
generating an image as a function of the corrected first and second sets of voxels.

17. The non-transitory computer readable storage medium of claim 16 wherein the correcting for the distortion is provided without a physics model.

18. The non-transitory computer readable storage medium of claim 16 wherein registering comprises non-rigid registering.

* * * * *